United States Patent [19]

Stirn et al.

[11] 4,321,099
[45] Mar. 23, 1982

[54] METHOD OF FABRICATING SCHOTTKY BARRIER SOLAR CELL

[76] Inventors: Robert A. Frosch, Administrator of The National Aeronautics and Space Administration, with respect to an invention of Richard J. Stirn, La Canada; Yea-Chuan M. Yeh, Santa Monica, both of Calif.

[21] Appl. No.: 225,501

[22] Filed: Jan. 16, 1981

Related U.S. Application Data

[60] Division of Ser. No. 93,714, Nov. 13, 1979, Pat. No. 4,278,830, which is a continuation-in-part of Ser. No. 837,513, Sep. 29, 1977, abandoned, which is a continuation-in-part of Ser. No. 683,073, May 4, 1976, abandoned, which is a continuation-in-part of Ser. No. 597,430, Jul. 21, 1975, abandoned.

[51] Int. Cl.$^3$ .................................................. H01L 31/18
[52] U.S. Cl. ........................................ 148/175; 29/572; 427/531; 427/74
[58] Field of Search .................... 136/255, 258, 262; 357/15, 30, 59; 148/174, 175, 176; 427/53.1, 74; 29/572

[56] References Cited

U.S. PATENT DOCUMENTS

| | | | |
|---|---|---|---|
| 3,368,125 | 2/1968 | Pasierb | 357/15 |
| 3,952,323 | 4/1976 | Tanimura et al. | 357/15 |

OTHER PUBLICATIONS

V. Y. Doo, "Thin Silicon Film Growth on Polycrystalline Alumina Ceramic", *J. Electrochem. Soc.*, vol. 111, pp. 1196–1198 (1964).

H. Hovel, "Semiconductors & Semimetals–vol. 11–Solar Cells", Academic Press, 1975, pp. 103–109.

*Primary Examiner*—Aaron Weisstuch
*Attorney, Agent, or Firm*—Paul F. McCaul; John R. Manning

[57] ABSTRACT

A Schottky barrier solar cell consists of a thin substrate of low cost material with at least the top surface of the substrate being electrically conductive. A thin layer of heavily doped n-type polycrystalline germanium, with crystalline sizes in the submicron range, is deposited on the substrate. But first a passivation layer may be deposited on the substrate to prevent migration of impurities into the polycrystalline germanium on a substrate of low-cost conductive material. Then the polycrystalline germanium is recrystallized to increase the crystal sizes in the germanium layer to not less than 5 microns, and preferably considerably more. It serves as a base layer on which a thin layer of gallium arsenide is vapor-epitaxially grown to a selected thickness. Then, a thermally-grown oxide layer of a thickness of several tens of angstroms is formed on the gallium arsenide layer. A metal layer, of not more than about 100 angstroms thick, is deposited on the oxide layer, and a grid electrode is deposited to be in electrical contact with the top surface of the metal layer. An antireflection coating may be deposited on the exposed top surface of the metal layer. In another embodiment, the recrystallized germanium layer serves as the substrate for a Schottky barrier solar cell with more than one active semiconductor layer. The techniques of forming the oxide layer are also applicable in forming an oxide layer between a metal layer and a semiconductor material which together form a Schottky barrier junction in any solar cell.

7 Claims, 4 Drawing Figures

4,321,099

METHOD OF FABRICATING SCHOTTKY BARRIER SOLAR CELL

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

CROSS REFERENCE TO RELATED APPLICATIONS

This is a division of application Ser. No. 093,714 filed Nov. 13, 1979, now U.S. Pat. No. 4,278,830, which in turn is a continuation in part of application Ser. No. 837,513 filed Sept. 29, 1977, abandoned, which is a continuation in part of application Ser. No. 683,073, filed May 4, 1976, abandoned, which is in turn a continuation in part application of application Ser. No. 597,430 filed July 21, 1975 and abandoned.

BACKGROUND OF THE INVENTION

The present invention generally relates to a light energy converting cell and, more particularly, to a Schottky barrier solar cell, and to a method of fabricating it.

In recent years, cells, using metal-semiconductor (Schottky) barriers in place of p/n junctions, to convert light energy to electrical energy, have been investigated. Such cells are often referred to as Schottky-barrier-type cells. Most of the investigation has been directed to converting sunlight to electrical energy. Therefore, hereinafter for explanatory purposes in describing the prior art as well as the invention, the cell will be referred to as the Schottky barrier solar cell. Some of the advantages of a Schottky barrier solar cell are its simplicity, higher current output and improved radiation resistance.

Typically, such a solar cell includes a substrate, consisting of a single crystal gallium arsenide (GaAs) wafer. The bottom side of the GaAs wafer is metallized to form one terminal of the cell, while a thin semiconductor layer of GaAs is then vapor-epitaxially grown on top of the GaAs wafer. A very thin layer of metal is deposited on top of the vapor-epitaxially grown GaAs layer. A grid electrode is then deposited on the metal layer to serve as the other cell terminal. Often, an antireflection coating is applied to the exposed surface of the metal layer. To provide sufficient strength for the cell, the single crystal GaAs wafer, which serves as the cell substrate, has to be relatively thick (on the order of about 10 mils. The cost of such a wafer is quite high, thereby greatly increasing the cell cost. Reducing cell cost would greatly increase the potential use of Schottky barrier solar cells.

OBJECTS AND SUMMARY OF THE INVENTION

It is a primary object of the present invention to provide a Schottky barrier solar cell on a low cost substrate.

Another object of the invention is to provide a Schottky barrier solar cell, characterized by the absence of a relatively thick and expensive single crystal GaAs substrate.

Yet another object is to provide a Schottky barrier solar cell on a passivated substrate of low cost material that might otherwise produce metallurgical problems during processing steps in fabricating it.

A further object of the present invention is to provide a new method of fabricating a relatively inexpensive Schottky barrier solar cell.

Yet a further object of the present invention is to provide new methods of forming an oxide layer in a solar cell.

These and other objects of the invention are achieved in one embodiment by providing a cell in which the substrate is a low cost material that is sufficiently strong to support the cell thereon. At least the top surface of the substrate is electrically conductive. In one embodiment a polycrystalline layer of heavily doped n-type germanium is deposited on the substrate. But first a passivation layer, such as a tungsten and/or tungsten-carbon alloy on a steel substrate, or conductive borides, carbides or nitrides of titanium, chromium, zirconium, niobium, molybdenum, tantalum and tungsten may be deposited on the substrate to prevent migration of impurities into the polycrystalline germanium. At this point the germanium layer crystalline size, i.e., the size of the crystals is very small, typically in the submicron range. The germanium layer, which serves as a base layer, is recrystallized in a manner described hereinafter to significantly increase the sizes of the crystals in it. Thereafter, a semiconductor material, e.g., a thin layer of GaAs, is vapor-epitaxially grown on the base layer. Then, an oxide layer is formed on the GaAs layer and a thin metal layer is deposited on the oxide layer. This is followed by forming the grid electrode on the metal layer, with antireflecting coating applied to the exposed surface of the metal layer.

The oxide layer contributes to a significant increase in the open-circuit voltage of the cell. The oxide layer may be formed by any one of several novel techniques, to be described hereinafter. These techniques may be used to form the oxide layer in any Schottky barrier solar cell and are not limited to the embodiment hereinbefore described.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
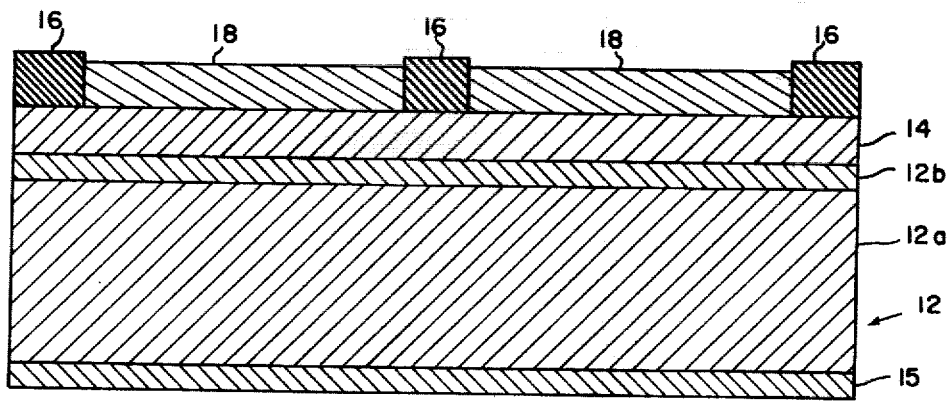
FIG. 1 is a cross section of a prior art Schottky barrier solar cell.

In order to highlight the advantages of the solar cell of the present invention and the structural differences between it and the prior art, attention is briefly directed to FIG. 1, which is a diagram of a prior art Schottky barrier solar cell. It consists of a relatively thick layer of semi-conductor material 12, on which a very thin layer or film of semitransparent metal 14 is deposited to form the Schottky barrier. In practice, the semiconductor material 12 typically consists of a heavily doped n-type single crystal GaAs wafer 12a on top of which a very thin layer 12b of GaAs is vapor-epitaxially grown. The thickness of the GaAs layer 12b is generally on the order of 5 to 20 microns.

As shown in FIG. 1 a large ohmic contact 15 is deposited on the bottom side of the GaAs wafer 12a, to form one contact or terminal of the cell. The second contact is in the form of a grid electrode 16, which is generally fabricated of a solderable metal deposited on the metal layer 14. An antireflection coating 18 may be deposited on the metal film 14 to minimize losses due to reflection of solar energy directed to the Schottky barrier solar cell.

In the Schottky barrier solar cell shown in FIG. 1, the GaAs wafer 12a effectively serves as the substrate or base layer of the cell, in which only layer 12b and metal layer 14 form the Schottky barrier. In order to properly support the layers of materials deposited on wafer 12a, as well as to provide overall physical strength to the cell for handling purposes, the wafer 12a has to be relatively thick. Typically, its thickness is on the order of not less than 10 mils.

As is appreciated, GaAs is a direct gap compound. In such a compound the diffusion length of the minority carriers, which are formed when photons are absorbed in the compound, is on the order of 1 micron. In order not to produce excessive recombination of the minority carriers at boundaries between crystals in layer 12b, as well as not to reduce the barrier height due to the crystal boundaries, it is important that the crystal sizes in layer 12b be quite large. Since the diffusion length of the minority carriers is about 1 micron, the crystal sizes should preferably be as large as possible, and generally not less than 5 microns.

In the prior art, the crystal sizes in layer 12b are much greater than 5 microns. In fact in the prior art base layer 12b is formed as a single large size crystal, since it is typically grown on the GaAs wafer 12a which is also formed as a single crystal. In practice, wafer 12a is a slice from a previously produced large single crystal GaAs ingot. The latter is sliced to customer specified thickness and area to form the GaAs wafer 12a. The production of such sliced single crystal GaAs wafers is very costly. For example, at present the cost of the single crystal GaAs wafer cut to a thickness of about 10 mils for use as a solar cell substrate is about $7 per square inch. The cost of the wafer represents a significant portion of the total solar cell cost. Its elimination would greatly reduce the solar cell cost.

In accordance with one aspect of the present invention the use of an expensive single crystal GaAs wafer as a substrate, or base layer, is avoided, thereby reducing the overall cost of manufacturing a useful Schottky barrier solar cell. The novel Schottky barrier solar cell of the present invention and the method of producing it may best be explained in connection with an exemplary embodiment, diagrammed in FIG. 2. The Schottky barrier solar cell 20 includes a substrate 22 made of a low cost material which is capable of providing the desired strength of the cell and support various layers thereon. If the substrate 22 is made of an electrically conductive material, it can be used directly as one of the cell's terminals. However, if it is made of an electrically insulating material, its top surface 22t should be coated with a layer of electrically conductive material to serve as one of the cell's terminals. The substrate 22 can be thought of as a layer of low cost material with at least its top surface electrically conductive. Examples of materials which can be used for the substrate 22 include, but are not limited to, nickel-iron, low-cost steel, carbon-coated graphite and metallized ceramic or alumina. The required thickness of the substrate depends on the particular material used. In general its thickness may be on the order of not less than 0.10 mm.

A thin polycrystalline layer 24 of heavily doped n-type germanium is laid down on the top surface 22t of the substrate. The germanium layer 24 may be deposited by evaporation or any equivalent process to produce a layer of a thickness on the order of a few (e.g., 5-10) microns. With presently known techniques, germanium layer 24 of relatively large surface area, and of submicron crystal sizes (i.e., sizes less than 1 micron), may be formed quite inexpensively. However, due to its small size crystals, such a layer is inadequate to serve as a base layer for a direct gap compound, e.g., GaAs, which together with a metal layer is to form a Schottky barrier junction. In accordance with the present invention the germanium layer 24, after first being deposited with submicron crystal sizes, is treated so as to increase significantly the sizes of its crystals in a direction perpendicular to the thickness of the layer. Briefly, the germanium layer 24 is recrystallized to form a polycrystalline germanium layer with crystal sizes on the order of not less than about 5-10 microns and preferably on the order of 100 microns, or more.

The recrystallization of the germanium layer 24 may be achieved by heating it to a temperature of about 940° C., which is the melting point of germanium, and thereafter permit it to cool down. Preferably, in recrystallizing the germanium layer, the germanium is heated to slightly below its melting temperature. Then it is selectively heated to its melting point by spot or line scanning its surface with a heat-producing source, e.g., a heat lamp, a laser, or an electron beam. After the germanium layer 24 has been recrystallized, so that the sizes of its crystals have been increased significantly to at least 5-10 microns, and preferably on the order of 100 microns, a thin layer 25 of GaAs is vapor-epitaxially grown on top of the germanium layer 24 to a desired thickness. The thickness of base layer 24 may be on the order of not more than 10 (e.g., 5-10) microns while the thickness of layer 25 may be on the order of not more than 5 microns.

The germanium layer 24 is a semiconductor base layer for the GaAs layer 25, the latter serving as the semiconductor electrically active layer which, together with a metal layer, forms the Schottky barrier. Since the sizes of the crystals in base layer 24 are relatively large, at least as compared with the original submicron crystal sizes, the crystal sizes of layer 25 grown on layer 24 are generally equal to those of the layer 24, i.e., not less than 5-10 microns and preferably on the order of 100 microns or more. Without the recrystallization of layer 24, the crystal sizes of layer 25 would be in the micron range. Such a layer would be useless for the purpose of forming a Schottky barrier solar cell.

Germanium and gallium arsenide have almost perfect matches in lattice parameters and in thermal expansion characteristics over the temperature range from room temperature to about 700° C., the growth temperature of GaAs. Consequently, the germanium layer 24 is an ideal base for the active GaAs layer 25, since built-in stresses between the two layers 24 and 25 will be greatly minimized, thereby resulting in improved electrical properties of the active GaAs layer 25. In order to prevent any interaction between the substrate 22 and the germanium layer 24 when the latter is recrystallized and during subsequent processing steps or to facilitate the initial deposition of the germanium on the substrate 22, it may be desirable to coat the top surface of the substrate with a metal such a tungsten. Such a metal is known to wet germanium well and thereby facilitate its deposition on the substrate. The tungsten may be deposited even when the substrate is of an electrically conductive material.

It has been discovered that such a tungsten or a tungsten-carbon layer will prevent excessive alloying and diffusion of the substrate material with and into the base semiconductor layer 24, and then the active semiconductor layer. An exemplary embodiment of a Schottky barrier solar cell with such a passivation layer will be described hereinafter with reference to FIG. 4.

After growing the GaAs layer 25, a thermally-grown oxide layer 26 may be formed on the GaAs layer 25. The thickness of the oxide layer, if formed, should generally be less than 100 (e.g., 30–50) angstroms. Then, a very thin layer or film of semitransparent metal 28 is deposited on the oxide layer 26. Generally, the metal layer thickness is about 100 angstroms or less. However, if desired, it may be thicker than 100 angstroms. The Schottky barrier is formed by the metal layer 28 and the GaAs active layer 25 with the interfacial oxide layer 26 therebetween. It has been discovered that such an oxide layer produces a marked increase in the cell's open-circuit voltage. Several techniques to form the oxide layer 26 will be described hereinafter.

Figure 2:
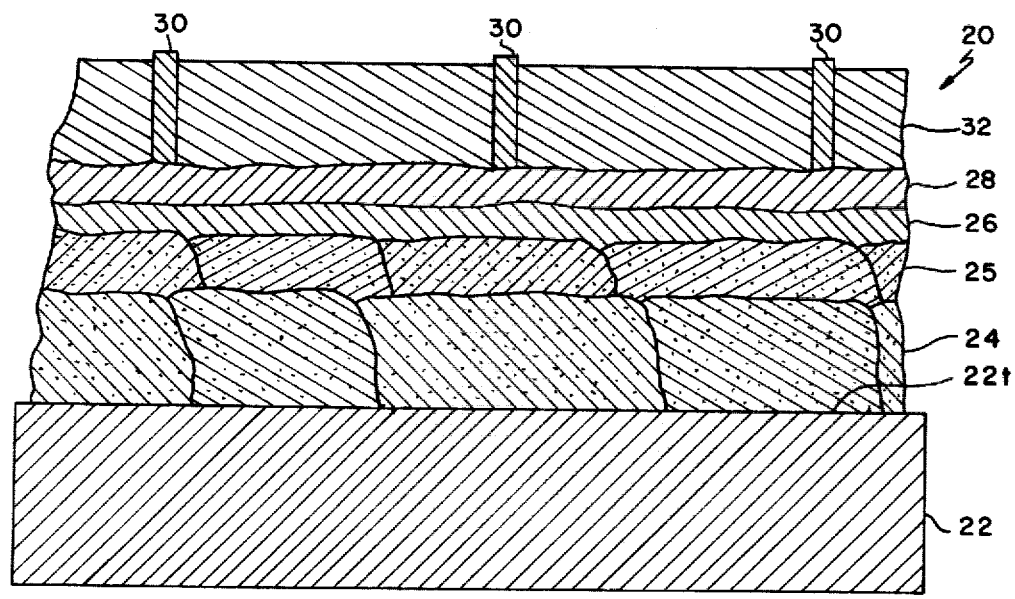
FIG. 2 is a cross section of an exemplary embodiment of a Schottky barrier solar cell of the present invention.

The cell manufacturing is completed by depositing a grid electrode 30, preferably of solderable metal to the metal layer. The grid electrode forms the second contact or terminal of the cell. As shown in FIG. 2, an antireflection coating 32 is applied to the top surface of metal layer 28. The function of the coating 32, as in prior art cells, is to reduce losses due to reflection of light energy from the cell surface.

From the foregoing description and a comparison of FIGS. 1 and 2, it should be appreciated that in the prior art a single crystal semiconductor wafer, such as the single crystal GaAs wafer 12a, shown in FIG. 1, is used as the substrate or base layer. The cost of such a single crystal semiconductor wafer is high, thereby increasing the cell cost. Such an expensive single crystal semiconductor wafer, serving as a substrate, is not used in the Schottky barrier solar cell of the present invention, wherein the substrate 22 and the recrystallizable germanium base layer 24 perform the function of the expensive single crystal GaAs wafer. The substrate 22 is made of a low cost material. Also gallium (Ga) is generally in short supply and relatively expensive. With the present invention, by eliminating the relatively thick GaAs wafer 12a, the need for large quantities of Ga is greatly reduced.

The active GaAs layer 25 cannot be readily grown directly on the substrate 22 because the latter is either amorphous or is in polycrystalline form with extremely small crystal sizes. Therefore the germanium layer 24 is first deposited on the substrate 22, and thereafter is recrystallized to form a large crystallite size (large crystals) polycrystalline base for the active GaAs layer 25. Consequently, when the latter is vapor-epitaxially grown on the germanium layer 24, its crystal sizes tend to match the relatively large crystal sizes of the recrystallized germanium layer. The initial deposition of the germanium layer on the substrate 22 in polycrystalline form with crystal sizes in the submicron range, and its subsequent recrystallization to form crystals of larger size, are amenable to continuous flow automated production. Thus, the cost of the Schottky barrier solar cell of the present invention, as compared with the cost of a prior art cell of equal area, in which an expensive single crystal semiconductor wafer is used as the substrate, can be reduced significantly, even though the layer 24 is first deposited and is subsequently recrystallized.

The invention has been described with reference to FIG. 2 as having a semiconductor base layer 24 consisting of germanium, and a semiconductor electrically active layer 25 consisting of GaAs. It should be pointed out that the invention is not intended to be limited to these particular semiconductor materials. The semiconductor active layer 25 need only consist of a semiconductor material with a band gap so as to efficiently convert the light directed thereto to current. The semiconductor base layer 24 need only consist of a recrystallizable semiconductor material which closely matches the semiconductor material chosen for the active layer 25 in lattice parameters and in thermal expansion characteristics over the temperature range of interest. This is quite significant, since it is important to eliminate, or at least minimize, the built-in stresses between the base layer 24 and the active layer 25.

When the active layer 25 consists of GaAs, the base layer 24 may consist of recrystallizable GaAs, or any of its ternary compounds, such as $GaAs_{1-x}P_x$, instead of germanium since GaAs has a melting temperature of 1298° C. Also, one of the ternary compounds of GaAs may be used as the active layer 25. In such a case, it would be preferred to use GaAs or one of its ternary compounds for the base layer 24. Also, any one of various metals may be used in forming the metal layer 28. Examples of metals which may be used include gold, palladium, silver and platinum.

In summary, the Schottky barrier solar cell of the present invention includes a substrate, formed of other than a single crystal semiconductor material. The substrate may be formed of an electrically conductive material, such as low-cost steel, nickle-iron or carbon-coated graphite, or of an electrically insulating material, such as ceramic or alumina, whose top surface is metalized. Thus, in general, the substrate may be thought of as other than a semiconductor material with at least its top surface being electrically conductive. Deposited on the substrate is a thin layer of a semiconductor material to form a semiconductor base layer, which is recrystallizable into a relatively large crystalline size polycrystalline base layer. A layer of semiconductor material is grown on the base layer to form an active semiconductor layer which, together with a very thin metal layer deposited thereon, forms a Schottky barrier. Preferably, an oxide layer of several tens of angstroms is formed between the metal layer and the active semiconductor layer.

The semiconductor material, chosen for the semiconductor active layer, is one having a band gap so as to optimize the conversion of incident light into electrical energy. The semiconductor material chosen for the base layer is one which matches as close as possible the lattice parameters and thermal expansion characteristics (over the temperature range of interest) of the semiconductor material of the active layer. A grid electrode is deposited on the layer to serve as one terminal of the cell. The other terminal of the cell is either the substrate, when the latter is of an electrically conductive material, or its metallized electrically conductive bottom surface.

As previously indicated it has been found that the oxide layer, such as layer 26 in FIG. 2, contributes to a significant increase in the open-circuit voltage of the cell. The oxide layer should preferably be on the order of 50 angstroms or less. However, it may be greater than 50 angstroms, e.g., on the order of about 100 angstroms. Since the oxide layer 26 is between the active semiconductor layer 25 and the metal layer 28, which together form the Schottky barrier, the oxide layer 26 may be thought of as an interfacial oxide layer.

The advantages realized from such an interfacial oxide layer, i.e., increased open-circuit voltage, are not limited to the solar cell of the present invention, hereinbefore described with reference to FIG. 2. The interfacial oxide layer may be formed in any Schottky barrier solar cell, such as the prior art cell, shown in FIG. 1. The interfacial oxide layer may be formed between the very thin active semiconductor layer 12b (see Fig. 1), which is vapor-epitaxially grown on the single crystal wafer 12a, and which together with metal layer 14 form the cell's Schottky barrier. In general, the interfacial oxide layer may be incorporated in any Schottky barrier solar cell between the metal layer and the active semiconductor material, which may consist of one or more layers of semiconductor material.

After extensive tests and analysis of the characteristics of the interfacial oxide layer, formed on an active semiconductor layer which contains arsenic (As), e.g., GaAs, it has been discovered that a meaningful increase in the cell's open circuit voltage ($V_{oc}$) is realized when the interfacial oxide layer contains arsenic (As) in an oxidation state of not less than $+3$ and preferably higher than $+3$. It is, of course, realized that the highest oxidation state of As is $+5$. Superior performance (increased $V_{oc}$) was obtained when the As oxidation state was greater than $+3$.

It should be stressed that when forming the interfacial oxide layer on GaAs the Ga is also oxidized. Also, any contaminants which may be present on the surface of the active semiconductor layer (25 in FIG. 2 or 12b in FIG. 1) e.g., organic matter, may be oxidized and form part of the interfacial oxide layer. Also, any contaminants in the chamber e.g., a furnace, in which oxidation is performed, as well as in the stream of the oxygen which is introduced into the oxidation chamber may affect the final composition of the oxide layer by becoming part of it and/or change the reaction pathway, i.e., the oxide characteristics.

In a controlled production process of forming the cell with the oxide layer, the presence of undesired contaminants may be eliminated or reduced to a minimum so that their effect may be neglected. In practice, after vapor-epitaxially growing the active semiconductor layer (layer 25 in FIG. 2, or layer 12b in FIG. 1), which is performed in a clean environmentally controlled chamber, the oxide layer is formed. This is achievable by introducing oxygen into the chamber and controlling the temperature for a selected period to form the oxide layer to the desired thickness of several tens of angstroms.

If only pure oxygen is introduced, the oxide layer will consist of only oxides of at least some of the constituents of the semiconductor layer. For example, if the semiconductor layer is GaAs the oxide layer may include both Ga and As in oxidized states. The layer may include separate patches of a Ga oxide and As oxide and/or an oxide containing both Ga and As, namely a Ga and As oxide. However, irrespective of the state of oxidation of the Ga, and whether or not it is in the form of an oxide, separate from the As oxide, or part of a Ga and As oxide, the state of oxidation of the As should be not less than $+3$, and preferably greater than $+3$. Various oxidation techniques may be used to produce the interfacial oxide layer on top of the As-containing semiconductor layer, as long as the state of the oxidation of the As is not less than $+3$.

In one process which has been found to be quite advantageous, ozone ($O_3$) was used as the oxidizing agent. In a specific embodiment in a cell with a semiconductor layer of GaAs the interfacial oxide layer was formed by placing the cell in a quartz tube furnace through which ozone was made to flow. The ozone was provided by an ozone generator which was supplied with oxygen at a flow rate of about 1 cubic foot per hour. The furnace temperature was in the range of about 100° C. to 200° C. An oxide layer of a thickness of less than 50 angstroms was formed in about 25 minutes at about 160° C. at atmospheric pressure. The open circuit voltage of the cell was about 0.64 volts as compared with 0.45 volts of a similar cell, but without the interfacial oxide layer. From various tests, which were performed, it was discovered that when using ozone as the oxidizing agent the time and temperature required to form the oxide layer, with As in the oxidation state of not less than $+3$, were not critical. Another advantage of using ozone is that the time required to form the oxide layer is reduced significantly.

In another actual reduction to practice the interfacial oxide layer was formed by passing oxygen ($O_2$) through water, e.g., deionized water at room temperature, e.g., 22° C., and atmospheric pressure. Thus, the oxidation was performed with humidified oxygen. In practice the top surface of the semiconductor active layer 25 was first cleaned. However, it is realized that despite such cleaning some native oxide layer may have remained thereon. The surface of layer 25 was exposed to the humidified oxygen to form the interfacial oxide layer. The greater the exposure time the thicker was the oxide layer which seemed to increase the efficiency. Layers were formed with exposure times from about 24 hours up to 200 hours, which resulted in oxides of thicknesses varying from about 30 to 40 angstroms. The open circuit voltages of the cells with these oxides varied from about 0.72 V up to 0.84 V. Most of them had open circuit voltages of approximately 0.8 V, which is very significant.

It should be pointed out that in a process in which the semiconductor active layer 25 is vapor-epitaxially grown, the oxide may be formed in a controlled environment so that any uncontrolled native oxide would be minimized. Thus, the interfacial oxide layer will consist practically entirely of a layer formed by oxidation with humidified oxygen, produced by passing oxygen through water. Such an oxide layer would effectively be a controlled native oxide of the desired thickness. A native oxide means an oxide of the composition and/or the constituents of the semiconductor active layer 25.

Experiments with reasonably satisfactory results have been performed in which a non-native oxide was physically deposited as the cell's interfacial oxide layer 26. The term non-native oxide refers to an oxide in which constituents, different from those of the semiconductor active layer 25, are present in the interfacial oxide layer 26.

In these experiments non-native oxides of $Sb_2O_3$ were deposited by vacuum deposition on GaAs layer 25 of various cells to thicknesses of about 15 to 25 angstroms. The open circuit voltage of these cells was also found to be in the range of 0.8 V. One advantage of $Sb_2O_3$ is that, due to its high vapor pressure, it is conveniently evaporated. Therefore, it can be deposited without any appreciable decomposition to form the non-native oxide on the surface of layer 25.

The non-native oxide in accordance with the present invention is not intended to be limited to $Sb_2O_3$. Other depositable oxides may be used. Preferably these oxides should be relatively stable so that they are not adversely affected by the high temperatures, produced during deposition. Some examples of other non-native oxides which may be used include $S_iO_x$, $Nb_2O_5$, $Ta_2O_5$. However, the invention is not intended to be limited to the above examples.

As should be appreciated the non-native oxides may be formed on the surface of layer 25 by any known deposition technique, e.g., vacuum evaporation or the like. One technique which is believed to be highly advantageous, and which is included in the scope of this invention, is forming the interfacial oxide layer by laser flash evaporation. In such a technique the oxide, e.g., a non-native oxide such as $Sb_2O_3$, may be evaporated by directing a focused laser beam to it. The oxide matter, subjected to the laser beam, tends to evaporate for deposition on the layer 25. With a laser beam the heating of the oxide is limited to the area exposed to the laser beam. By scanning the laser beam over the oxide, selected areas thereof may be melted or evaporated, without having to expose the entire oxide to very high temperatures, needed to melt or evaporate it. Thus, the dangers of oxide decomposition and/or adverse effects on the semiconductor active layer 25 due to high temperatures are greatly reduced, since the deposition of the interfacial oxide layer by evaporating the oxide with laser flashing can be achieved at relatively low temperatures of the active layer on which the oxide is deposited.

Also, flash evaporation by means of a laser has been found to be advantageous when depositing the antireflection layer 32 of certain materials. For example, it was found that when layer 32 of $Ta_2O_5$ was deposited, such as by electron beam evaporation, cell degradation was noted. It is likely that such degradation may have been due to possible penetration of soft x-rays or energetic particles into and through metal layer 28 to the barrier. However, such degradation is significantly eliminated by flash evaporation by means of a laser the $Ta_2O_5$ to form the antireflection layer 32. It is believed to be desirable to deposit either the oxide layer 26 and/or the antireflection layer 32 by laser flash evaporation.

In another experiment a satisfactory interfacial oxide layer was formed with oxygen and/or ozone as the oxidizing agent or agents and in the presence of a phenolic epoxy resin in the oxidation chamber. Satisfactory interfacial oxide layers may be expected when using pure oxygen and/or ozone together with small amounts of oxidizing-stimulating gases, on the order of about 1% or more of the total flow rate. Some examples of such gases are CO, NO and $NO_2$.

Also, the oxide layer may be formed with a liquid, either aqueous or not, containing oxidizing matter. For example, water containing a few percent of hydrogen peroxide may be used. Also, potassium permanganate, dissolved in a nonaqueous solvent may be used. Generally, in all processes in which oxidation is performed with a liquid, rather than gas, after forming the desired interfacial oxide layer, the cell may be dried by including an annealing step, preferably in the presence of a nonreactive gas.

In FIG. 2, only a single layer 25 of active semiconductor material is shown in the base layer 24, with layer 25 together with the metal layer 28 forming the Schottky barrier. If desired, the active semiconductor material, represented by single layer 25, may consist of more than one layer. Such an arrangement, which will be described in connection with FIG. 3, may be particularly desirable when the cell is used to convert solar energy, i.e., sunlight, into electrical energy.

As is appreciated, sunlight includes energy in a spectrum of wavelengths rather than at one specific wavelength. The sunlight spectrum is such that the optimum band gap in terms of electron volts (eV) is in the range of 1.5 eV–1.7 eV. GaAs has a band gap of 1.4 eV. Therefore, its use in a Schottky barrier solar cell for converting sunlight into electrical energy is more desirable than silicon (which has a band gap of 1.1 eV), since the GaAs band gap is closer to the optimum band gap with respect to the sunlight spectrum. Also, since GaAs has a band gap which is greater than that of silicon, when the GaAs is used in Schottky barrier solar cell, the output voltage is greater than that experienced when silicon is used in a similar type cell. However, even though GaAs is preferred over silicon, since its band gap is 1.4 eV, which is below that of high energy photons of the sunlight, the efficiency of converting the energy of the latter when using GaAs is lower than desirable.

Figure 3:
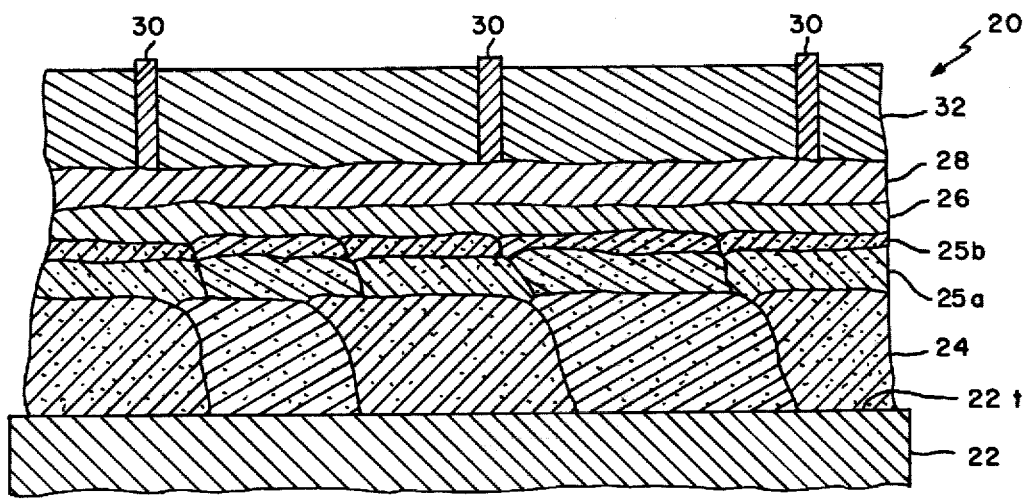
FIG. 3 is a cross section of another embodiment of a Schottky barrier solar cell of the present invention.

When fabricating a cell for converting sunlight into electrical energy, it is preferable to deposit two layers on the recrystallized base layer 25, as shown in FIG. 3. Therein, the two layers, replacing the single layer 25 of FIG. 2, are designated by 25a and 25b. Layer 25a which is first deposited on the recrystallized base layer 24 is preferably GaAs. Its thickness is not very critical. Preferably, it should be on the order of only several microns in order to reduce fabrication cost. The second layer 25b is formed on top of layer 25a. Layer 25b is formed of a semiconductor material which has a higher band gap than that of GaAs. For example, layer 25b may consist of a ternary compound of GaAs, such as $Al_xGa_{1-x}As$. By controlling x the aluminum gallium arsenide layer 25b may have a band gap around 2.0 eV. Such a layer is a more efficient converter of the energy of high energy photons, i.e., those photons with energies above 2.0 eV than GaAs which has a considerably lower band gap. Also, since layer 25b has a band gap greater than that of GaAs the cell's output voltage is higher than that of a cell with only GaAs.

Since the band gap of layer 25b, assumed to be around 2.0 eV, is significantly higher than about 1.5 eV, which is the optimum band gap for sunlight spectrum, it is recognized that layer 25b alone would not be an efficient converter of sunlight. Photons with energies below that of 2.0 eV will not be absorbed in layer 25b and therefore will not generate current-producing carriers. Layer 25b is made very thin (on the order of one tenth micron or less, e.g., a few hundred angstroms). Therefore, photons with energies below 2.0 eV pass through layer 25b and are absorbed in the lower layer 25a, where they generate minority and majority carriers. Since layer 25b is very thin the minority carriers move through layer 25b to the barrier and thereby contribute to the output current.

The thinness of layer 25b does not affect the absorption therein of photons with energies not less than about 2.0 eV. This is due to the fact that layer 25b is of a gallium arsenide ternary compound which is a wide band gap semiconductor material. In such a material photons are absorbed very close to the material's top surface. Due to the presence of the metal layer 28 an electric field is present in what is referred to in the art as the space charge region. As a result it is believed that the minority carriers, generated in layer 25b, drift to the barrier under the influence of the electric field. The oxide layer 26, when present, is so thin, less than 100 angstroms and preferably not more than 50 angstroms, and therefore does not affect the electric-field-aided collection of the minority carriers.

As to the carriers generated in layer 25a, since layer 25b is very thin (not more than 1 micron), it is likely that at least some of these minority carriers, i.e., those generated in layer 25a, also drift to the barrier through layer 25b under the influence of the electric field, while some of the minority carriers generated deeper in layer 25a may move to the barrier by diffusion. In either case, most of the minority carriers generated in layer 25a move through thin layer 25b to the barrier and thereby contribute to the output current. In practice, layers 25a and 25b may be vapor-epitaxially grown in the base layer 24 after the latter is recrystallized so as to increase the sizes of its crystals. Thus, the sizes of the crystals in layers 25a and 25b will be on the order of those in the base layer 24, namely not less than 5 to 10 microns and preferably more.

The techniques of epitaxially growing layers of semiconductor materials are well developed for GaAs and its ternary compounds. Due to the mismatch in band gap between layers 25a and 25b it is important to grow layer 25b on layer 25a, so as to minimize the effect of any potential barrier between them. A spike or abrupt break may be present in the conduction band. If so, this may possibly be eliminated by first growing layer 25a and gradually converting into the ternary compound of GaAs over a thickness of a few hundred angstroms or so, and thereafter continue to grow the layer 25b to possess the desired band gap. This can be done by controlling the temperatures and gradually increasing the amount of the particular material, e.g., Al which is added to the GaAs. The effects of the known potential barrier of about 0.6 eV are mainly overcome by growing layer 25b thin enough, e.g., a few hundred angstroms to allow the aforementioned electric field to influence the minority carriers at such potential barrier.

Generically one can regard each of the cells shown in FIGS. 2 and 3 as a cell with a first layer of polycrystalline semiconductor material, such as the base layer 24, and a second layer of polycrystalline active semiconductor material on top of the first layer. In FIG. 2, the second layer 25 is assumed to be a single layer of one type of material, e.g., GaAs or its ternary compound, while in FIG. 3 the second layer is a multilayer member and includes layers 25a and 25b, which have different band gaps. As previously pointed out, in production, layer 25a may first be grown and thereafter gradually add matter, e.g., Al, resulting in the formation of an intermediary layer of a few hundred angstroms and thereafter grow layer 25b.

One can view layers 25a and 25b as a single layer of polycrystalline semiconductor material with one portion or region, such as 25a adjacent the base layer 24, of one band gap and with an opposite portion or region, such as 25b adjacent the oxide layer 26, of a different band gap. Also an intermediary region may be included in the single active layer which includes regions 25a and 25b in which the band gap varies from that of layer region 25a to that of layer region 25b. Thus layers 25a and 25b can be thought of as separate layers, or as separate regions of a single layer, with or without an intermediary region. It should be apparent that although layer 25a has been described as GaAs, and the wide band gap layer 25b has been described as AlGaAs, other compounds may be used. For example, semiconductor materials, other than GaAs and its ternary compounds, may be employed to form the relatively narrow band gap layer 25a and the wider band gap layer 25b, while insuring that no barrier is created between them.

It should be pointed out that although the interfacial layer has been described as the oxide layer and methods of producing it have been described, the invention is not intended to be limited thereto. For example, rather than depositing an oxide interfacial layer an interfacial layer of a native or non-native nitride may be deposited. Thus, in the broad sense, and in accordance with the invention, the interfacial layer should be viewed as one having dielectric properties.

Figure 4:
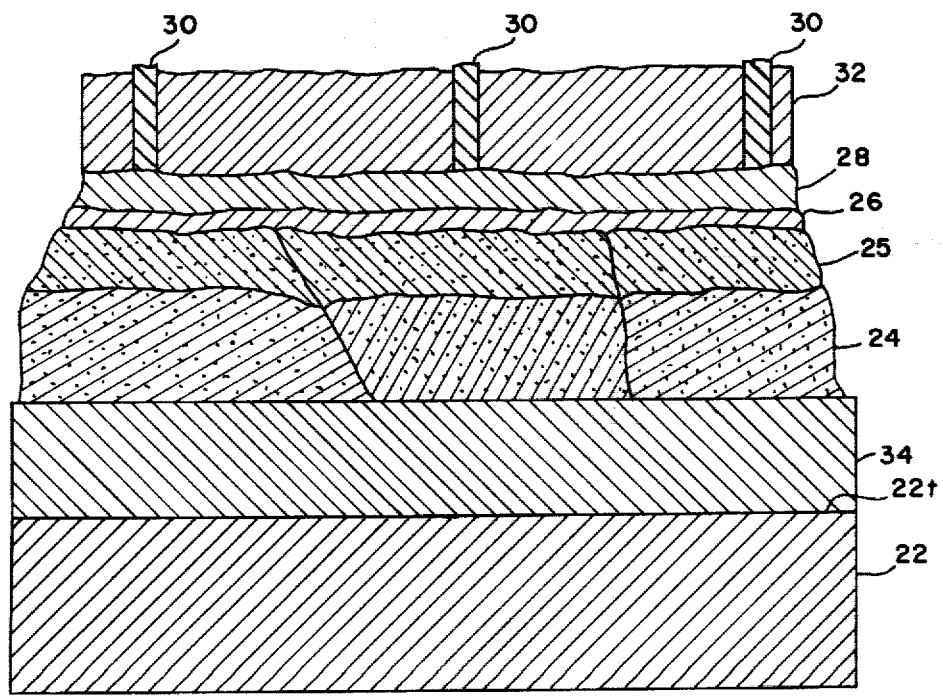
FIG. 4 is a cross section of yet another embodiment of a Schottky barrier solar cell of the present invention with a passivated substrate of low cost material.

Referring now to FIG. 4, a third embodiment of the present invention is illustrated with a single active layer 25 as in FIG. 2. For convenience, the same reference numerals are employed for the same elements as in the embodiment of FIG. 2. A comparison with FIG. 2 will thus readily show that what is added is a passivation layer 34 a few (1-4) microns thick. This layer serves to prevent interaction of low cost conductive substrate material, such as steel, with the semiconductor layers 24 and 25.

When low cost materials are utilized as conducting substrates of thin-film solar cells, they tend to introduce metallurgical problems due to excessive alloying and/or diffusion of the substrate material with and/or into the semiconductor film during subsequent processing steps. Some form of passivation layer is needed to prevent interaction of such substrates with the semiconductor layers. The solution to this problem is to coat the substrate with a passivation layer (PL). The criteria for choosing the material for the PL can be described as follows: (1) the rate of interdiffusion of the substrate and the Ge or GaAs semiconductor layer through the PL should be small; (2) the loss-rate of the PL into the adjacent materials should be small; (3) the PL should be thermodynamically stable; (4) there should be strong adhesion between the PL and the adjacent materials; (5) the PL should be pinhole free; (6) the PL should be resistant to thermal and mechanical stresses; (7) the specific contact resistance between the PL and the adjacent materials should be small; and (8) the PL should be thermally and electrically conducting. All these conditions may not be fulfilled at once, necessitating a compromise. In determining what compromise, an empirical approach is used due to lack of experimental data associated with most coatings. Because of the demonstrated usefulness of tungsten, W, in terms of the Ge bonding, wetability, and Ge crystallite size upon recrystallization, studies on the use of thin chemical vapor deposit (CVD) coatings of W, or of tungsten-carbon (W:C) alloys in conjunction with Ni-plated layers on steel, were investigated and found to be satisfactory. The purpose of the Ni coating is to improve bonding between the W and the steel, but it is not a necessary condition.

Tungsten films are deposited by reduction of $WF_6$ in $H_2$ ($WF_6 + 3H_2 \rightarrow W + 6HF$) at 550 C.–570 C. To test the effectiveness of W thus deposited as a passivation layer, sheets of Ni were coated and later sheared or sawed to a standard substrate size of $22 \times 22$ mm on which subsequently 0.1 microns of Si and 10 microns of Ge were deposited. The thin Si layer served to promote the bonding of Ge to W. Energy dispersion analysis by X-ray (EDAX) showed that at low laser-power levels (<30 watts), no Ni appeared on the top surface after recrystallizing the Ge with 530 C. background-heating temperature. Only when the laser power was increased to 50 watts, with other conditions unchanged, were considerable amounts of Ni seen on the surface.

The effectiveness of the CVD W film as a passivation layer is thus seen to be poor at higher-laser levels. When the laser power was further increased to 80 watts with all other conditions fixed, total failure of the W film as a passivation layer was evident from the observation of excessive alloying between Ge and Ni.

Further investigation of W for use as a passivation layer was made by analyzing a cross-section of one of the recrystallized samples with an electron microprobe. This analysis showed that the area under the center of the laser heating had excessive migration of Si and Ge through the W passivation layer into the Ni substrate. In addition, the Ni penetrated through microcracks of the U passivation layer and alloyed with the Ge.

Since these CVD W samples were subjected to shearing and sawing before the deposition of Ge, the question arises as to whether the cutting process introduced stress in the CVD layer, thereby inducing microcracks. Therefore, CVD W films were deposited on Ni sheet substrates precut to the $22 \times 22$ mm size. In addition, different growth-temperatures (400 C.–900 C.) were used to vary the built-in stresses due to mismatches between the W layer and Ni sheet. Hydrogen-to-$WF_6$ gas ratios were also varied with the temperature in order to maintain the desired fine-grain, noncolumnar growth of W. These samples did show reduced diffusion of Ni through the W and Ge films after recrystallization. However, unacceptable amounts of Ni and other metallic contaminations still appeared randomly with the standard amount of background heating (530 C.) and laser power (60–80 watts).

Subsequently, deposition of CVD W and W:C (1%) coatings (CM-500) prepared by Chemetal Company, Pacoima, Calif., on C1018 low-carbon steel substrates were tested. The steel substrates had first been plated with a thin Ni coating to improve the bonding of the CVD coatings. Conventional thickness of Si (0.1 microns) and Ge (10 microns) were then e-gun deposited and the samples recrystallized with 530 C. background heating and 80 watts of laser power. A scanning electron microscope (SEM) photograph of the recrystallized Ge/Si/CM500/Ni/Steel substrate shows small, light lumps of tungsten-germanium alloys as is usually seen with bulk W sheet. A large, light lump of Cu was also found and believed to be due to contamination from the e-gun hearth. That problem of Cu contamination can, of course, be avoided in producing Schottky barrier solar cells. No evidence of Ni or Fe was seen, indicating that CM500 coatings may act as a passivation layer for low-cost C1018 steel substrates. However, the problem of W and Ge alloying still remains, at least with the present conditions of background temperature and laser power.

From this investigation, it has thus been demonstrated that for solar cells made in accordance with the present invention using low-cost conductive materials, a passivation layer may be required to prevent interaction of the low-cost substrates with the semiconductor layers, and that the proper passivation layer material to use may be determined empirically. For the example of steel with a nickel coating to improve contact (bonding) of the passivation layer, tungsten or preferably an alloy of 1% carbon in tungsten has been successfully used. Since bonding is a separate problem that may not be significant, or which can be solved by use of other coating techniques, it is clear that for a steel substrate, the passivation layer may be tungsten or a tungsten-carbon alloy. For other low-cost conductive materials used as substrates in solar cells made in accordance with the present invention, still better material may be found for use as a passivation layer, but a good initial selection of material is tungsten, an alloy of tungsten and carbon, or conductive borides, carbides, or nitrides of titanium, chromium, zirconium, niobium, molybdenum, tantalum and tungsten.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A method of fabricating a Schottky barrier GaAs solar cell for converting incident light energy to electrical energy, the steps comprising:
   providing a substrate with at least the top surface thereof being of electrically conductive material;
   depositing by chemical vapor deposition on the top surface of said substrate an epitaxial layer of polycrystalline semiconductor material about 5–10 microns thick to form a semiconductor base layer;
   recrystallizing said polycrystalline semiconductor material of said base layer so as to increase the average crystalline grain size thereof, as measured in a direction perpendicular to the thickness of said base layer, to at least equal to the thickness of said base layer;
   epitaxially depositing a layer of GaAs containing semiconductor material on said base layer to form a semiconductor active layer, the semiconductor materials of said base layer and said active layer having substantially matched lattice parameters and thermal expansion characteristics over a selected temperature range;
   forming an outside protective layer, including at least a layer of a semitransparent metal on said semiconductor active layer, with light energy reaching said active layer through said protective layer; and
   attaching in electrical contact a grid electrode to said metal layer.

2. The method as described in claim 1 wherein said GaAs containing semiconductor active layer is vapor-epitaxially grown on top of said base layer to a preselected thickness, using a material selected from the group consisting of gallium arsenide and a gallium arsenide ternary compound.

3. The method as described in claim 1 wherein the step of recrystallizing comprises the step of heating said polycrystalline semiconductor material to just below its melting temperature and thereafter selectively heating it to its melting temperature by scanning its surface with a beam of energy, whereby a moving zone of said polycrystalline material is momentarily heated to its melting temperature and then immediately cooled to below its melting temperature.

4. The method as described in claim 1 wherein said base layer is selected from the group consisting of germanium, gallium arsenide, and a gallium arsenide ternary compound.

5. The method as described in claim 1 wherein said outside layer is comprised of an oxide layer formed on said active layer and said layer of semitransparent metal deposited on said oxide layer, and said oxide layer is formed by exposing the top surface of said active layer to humidified oxygen at preselected temperature and pressure for a predetermined time interval.

6. The method as described in claim 1 wherein said outside layer is comprised of an oxide layer formed on said active layer and said layer of semitransparent metal deposited on said oxide layer, and said oxide layer is formed by depositing on the active layer at least one oxidized constituent, which differs from any of the constituents of the active layer.

7. The method as described in claim 6 wherein the deposition of said oxidized constituent as part of the deposition of said oxide layer is performed by subjecting the oxidized constituent to be deposited on said active layer to a laser beam.

* * * * *